(12) United States Patent
Lee et al.

(10) Patent No.: US 10,371,716 B2
(45) Date of Patent: Aug. 6, 2019

(54) METHOD AND APPARATUS FOR SOCKET POWER CALIBRATION WITH FLEXIBLE PRINTED CIRCUIT BOARD

(71) Applicant: Advantest Corporation, Tokyo (JP)

(72) Inventors: Donald Lee, San Jose, CA (US); Daniel Lam, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 200 days.

(21) Appl. No.: 15/196,695

(22) Filed: Jun. 29, 2016

(65) Prior Publication Data

US 2018/0003736 A1  Jan. 4, 2018

(51) Int. Cl.
*G01R 1/04* (2006.01)
*G01R 1/24* (2006.01)
*G01R 31/28* (2006.01)
*G01R 35/00* (2006.01)

(52) U.S. Cl.
CPC ............ *G01R 1/0441* (2013.01); *G01R 1/24* (2013.01); *G01R 31/2834* (2013.01); *G01R 35/005* (2013.01)

(58) Field of Classification Search
None
See application file for complete search history.

(56) References Cited

U.S. PATENT DOCUMENTS

| | | | |
|---|---|---|---|
| 3,902,785 A | 9/1975 | Matthews | |
| 3,995,238 A | 11/1976 | Knox et al. | |
| 4,564,260 A | 1/1986 | Dirmeyer et al. | |
| 4,848,866 A | 7/1989 | Feulner et al. | |
| 5,102,352 A | 4/1992 | Arisaka | |
| 5,181,025 A | 1/1993 | Ferguson et al. | |
| 5,488,380 A * | 1/1996 | Harvey | H01Q 21/0025 333/248 |
| 5,708,296 A | 1/1998 | Bhansali | |
| 5,886,671 A * | 3/1999 | Riemer | H01Q 1/28 342/368 |
| 7,648,285 B2 | 1/2010 | Maletzky et al. | |
| 8,600,309 B2 | 12/2013 | Chang et al. | |
| 9,310,422 B2 | 4/2016 | Nath et al. | |

(Continued)

FOREIGN PATENT DOCUMENTS

| | | |
|---|---|---|
| CN | 201820177 U | 5/2011 |
| EP | 1317684 A2 | 6/2003 |
| JP | 2005354368 A | 12/2005 |

*Primary Examiner* — Melissa J Koval
*Assistant Examiner* — Nasima Monsur

(57) ABSTRACT

A structure for performing socket power calibration comprises a plurality of socket ports on a load board electrically coupled to a plurality of traces on a first end of a flexible printed circuit board, wherein the plurality of traces are configured to allow traversal of an electrical signal from the plurality of socket ports to a waveguide. The structure further comprises the plurality of traces, wherein the traces are operable to terminate on a second end of the flexible printed circuit board into a plurality of patch antennas, wherein the plurality of patch antennas is adapted to radiate the electrical signal into the waveguide. Finally, the structure also comprises a power sensor electrically coupled to the waveguide, wherein the waveguide is configured to communicate the electrical signal from the waveguide to the power sensor.

20 Claims, 8 Drawing Sheets

(56) References Cited

U.S. PATENT DOCUMENTS

| | | |
|---|---|---|
| 9,490,540 B1 | 11/2016 | Davies et al. |
| 9,588,173 B2 | 3/2017 | Isaac et al. |
| 9,692,102 B2 | 6/2017 | Herbsommer et al. |
| 2006/0097737 A1* | 5/2006 | Parker ................ G01R 31/2818 174/250 |
| 2007/0154155 A1 | 7/2007 | Brist et al. |
| 2008/0048639 A1 | 2/2008 | Sutono et al. |
| 2009/0153158 A1 | 6/2009 | Dunn et al. |
| 2011/0018657 A1 | 1/2011 | Cheng et al. |
| 2011/0316734 A1* | 12/2011 | Svensson ................ H01Q 9/16 342/175 |
| 2012/0084968 A1 | 4/2012 | Nath et al. |
| 2012/0268153 A1* | 10/2012 | Nickel ............... G01R 31/3025 324/754.31 |
| 2013/0016022 A1 | 1/2013 | Heiks et al. |
| 2013/0200912 A1 | 8/2013 | Panagas |
| 2013/0200915 A1 | 8/2013 | Panagas |
| 2013/0200917 A1 | 8/2013 | Panagas |
| 2014/0007674 A1 | 1/2014 | Weinzierle et al. |
| 2014/0111239 A1 | 4/2014 | Blair et al. |
| 2014/0285277 A1 | 9/2014 | Herbsommer et al. |
| 2014/0312987 A1 | 10/2014 | Morita et al. |
| 2015/0168486 A1* | 6/2015 | Isaac ................ G01R 31/2889 324/756.02 |
| 2016/0025788 A1 | 1/2016 | Fujita et al. |
| 2016/0276996 A1 | 9/2016 | Tze-Meng et al. |
| 2016/0356842 A1 | 12/2016 | Lee |
| 2017/0102409 A1 | 4/2017 | Sarhad et al. |
| 2017/0227598 A1 | 8/2017 | Lam et al. |
| 2017/0229754 A1 | 8/2017 | Lee et al. |
| 2017/0279491 A1 | 9/2017 | Lam |

\* cited by examiner

METHOD AND APPARATUS FOR SOCKET POWER CALIBRATION WITH FLEXIBLE PRINTED CIRCUIT BOARD

CROSS-REFERENCE TO RELATED APPLICATIONS

This application is related to patent application Ser. No. 15/016,124, filed Feb. 4, 2016, entitled "WAVE INTERFACE ASSEMBLY FOR AUTOMATIC TEST EQUIPMENT FOR SEMICONDUCTOR TESTING," which is herein incorporated by reference in its entirety. This application is also related to patent application Ser. No. 15/016,143, filed Feb. 4, 2016, entitled "PLATING METHODS FOR MODULE AND/OR GANGED WAVEGUIDES FOR AUTOMATIC TEST EQUIPMENT FOR SEMICONDUCTOR TESTING," which is herein incorporated by reference in its entirety. This application is also related to patent application Ser. No. 15/016,133, filed Feb. 4, 2016, "MULTIPLE WAVEGUIDE STRUCTURE WITH SINGLE FLANGE FOR AUTOMATIC TEST EQUIPMENT FOR SEMICONDUCTOR TESTING," which is herein incorporated by reference in its entirety. This application is also related to patent application Ser. No. 15/016,151, filed Feb. 4, 2016, entitled "INTEGRATED WAVEGUIDE STRUCTURE AND SOCKET STRUCTURE FOR MILLIMETER WAVEBAND TESTING," which is herein incorporated by reference in its entirety.

FIELD OF THE INVENTION

Embodiments of the present disclosure generally relate to Automatic Test Equipment (ATE) for testing electronic components.

BACKGROUND

Automatic Test Equipment (ATE) is commonly used within the field of electronic chip manufacturing for the purposes of testing electronic components. ATE systems both reduce the amount of time spent on testing devices to ensure that the device functions as designed and serve as a diagnostic tool to determine the presence of faulty components within a given device before it reaches the consumer.

ATE systems can perform a number of test functions on a device under test (DUT) through the use of test signals transmitted to and from the DUT. Conventional ATE systems are very complex electronic systems and generally include printed circuit boards (PCB), coax cables and waveguides to extend the signal path of test signals transmitted from the DUT to a tester diagnostic system during a test session. However, increases to the length of the signal path, particularly at millimeter frequencies, can result in substantial loss of signal strength which can degrade the integrity of test signals transmitted from the DUT at high frequencies.

Conventional ATE systems use PCBs that include several centimeters of microstrip transmission lines disposed on the surface of a PCB to convey test signals from a DUT to a tester diagnostic system. Accordingly, the elongation of the test signal path caused by use of longer microstrip transmission lines as well as other components, such as coax cables by modern ATE systems can result in unnecessary signal loss at high frequencies.

FIG. 1 illustrates an exemplary interface assembly for testing DUTs. Typically the DUT 102 is inserted into a socket 101 affixed to a PCB 105, wherein the DUT communicates to the tester (ATE source 110 or ATE receiver 111) through the PCB 105 and the waveguide assembly 120. The socket 101 is a physical device having connectors for electrically interfacing with IO pins (e.g. solder ball 102) of the DUT. Manufacturers of the DUTs and test engineers testing the DUTs typically need to know the electrical characteristics of the socket interface with respect to the tester in order to accurately test the device especially at high frequencies.

For example, if the DUT is producing power, a test engineer would need to know how much power is being produced right at the DUT IO pin 180 that is then transmitted through channel 192 before being received at the ATE receiver 111. Typically, the power will attenuate as the signal transmits along path 192, therefore, it would be important for the test engineer to know the power being produced right at the IO pin of the DUT in order to perform a more accurate calibration. Similarly, if the DUT receives power from the ATE source 110 through channel 191 at IO pin 102, a test engineer would need to know precisely how much power is being received at IO pin 102 in order to perform a more precise calibration.

However, conventional methodologies of determining the electrical characteristics of the socket and performing power calibration for the socket are deficient because they are either prohibitively expensive or impractical.

FIG. 2 illustrates an exemplary methodology for performing socket power calibration that is conventional. FIG. 2 illustrates a sandwich style socket calibration device, wherein an elastomer layer is sandwiched between two PCB boards. The upper PCB 202 stimulates the DUT and contains a cable connector that can be connected to a network analyzer for measuring the electrical characteristics of the socket layer 205 which is sandwiched between the PCB boards. The lower PCB 204 can be connected to a tester system via another cable connector. Typically, 1 mm cable connectors 210 are used to interface to the network analyzer (and tester) and are placed on the PCBs. Traces on the PCBs couple the cable connectors to the socket ports.

The methodology illustrated in FIG. 2, while functional, has several drawbacks. First, it typically uses a high frequency (e.g. 110 GHz) network analyzer which can be prohibitively expensive and is highly specialized and complex requiring a highly skilled engineer to set up and deploy. Thus, the methodology of FIG. 2 is not practical for use in a production testing floor with lower skilled technicians. Further, not only is the network analyzer itself expensive, but the 1 mm cable connectors and other elements needed for this methodology are also extremely costly. Further, since the PCBs are rigid, they limit the orientation of the device with respect to the tester. In other words, it may be difficult to physically interface the network analyzer with the ports on the DUT because a bottom-only mounting position is available. Finally, the long PCB traces introduce loss and, further, the design is only single ended. As a result, conventional methods of performing power socket calibration are impractical and cost-prohibitive.

SUMMARY OF THE INVENTION

Accordingly, a need exists for an apparatus and/or method that can implement the required tests and address the problems with the approaches described above. Using the beneficial aspects of the apparatus and/or method described, without their respective limitations, embodiments of the present disclosure provide novel solutions to address these problems.

Embodiments of the present invention provide a method of performing power calibration on a socket without the use of expensive bench equipment like network analyzers. In one embodiment, the present invention is a socket calibration device that interfaces with the socket ports (or DUT IO pins) on one end and also interfaces with a waveguide and power sensor at the other end. The power sensor is typically much easier to use and reasonably priced as compared to a network analyzer. Further, test floor technicians can readily set up and deploy the power sensor for socket calibration as compared to a complex and sophisticated network analyzer. Therefore, embodiments of the present invention can be deployed on a high volume manufacturing test floor.

In one embodiment, the socket calibration device of the present invention is composed of a flexible printed circuit board (PCB) mode of a liquid crystal polymer material that contains traces. At one end of the flexible PCB, the traces on the PCB connect to socket ports or DUT I/O pins. PCB ports on the flexible PCB can be used to connect to the socket ports for calibration. On the other end of the flexible PCB, the traces of the PCB end at patch antenna ports which couple with a waveguide. The waveguide then connects with a power sensor that is used for calibration of the socket ports. The flexible PCB can allow the power sensor to advantageously mount from the side so that the orientation of the load board or DUT is not limited.

Embodiments of the present invention have significant advantages over prior techniques. The socket calibration device including the flexible PCB and the power sensor of the present invention is significantly more affordable and less complex to use than expensive and sophisticated bench equipment such as network analyzers. Further, the socket calibration device of the present invention provides differential signaling, which provides more versatility to test engineers in comparison to the single ended signaling of prior techniques. Additionally, the flexible PCB allows the socket calibration device to offer more orientations for mounting with the power sensor, e.g., the power sensor can be advantageously mounted from the side. And, finally, use of the power sensor provides much easier measurement techniques as compared to a network analyzer.

In one embodiment, a structure for performing socket power calibration is presented. The structure comprises a plurality of socket ports on a load board electrically coupled to a plurality of traces on a first end of a flexible printed circuit board, wherein the plurality of traces are configured to allow traversal of an electrical signal from the plurality of socket ports to a waveguide. The structure further comprises the plurality of traces, wherein the traces are operable to terminate on a second end of the flexible printed circuit board into a plurality of patch antennas, wherein the plurality of patch antennas is adapted to radiate the electrical signal into the waveguide. Finally, the structure also comprises a power sensor electrically coupled to the waveguide, wherein the waveguide is configured to communicate the electrical signal from the waveguide to the power sensor.

In another embodiment, a method of performing socket power calibration is disclosed. The method comprises transmitting an electrical signal from a plurality of socket ports on a load board to a plurality of traces on a first end of a flexible printed circuit board, wherein the plurality of traces are configured to allow traversal of an electrical signal from the first end to a second end of the flexible printed circuit board. The method also comprises radiating the electrical signal from a plurality of patch antennas on the second end of the flexible printed circuit board into a waveguide. Further, the method comprises measuring a power of the electrical signal using a power sensor, wherein the power sensor is electrically coupled to the waveguide, and wherein the waveguide is configured to communicate the electrical signal from the patch antennas to the power sensor.

In a different embodiment, a structure for performing socket power calibration is disclosed. The structure comprises a plurality of device under test (DUT) input/output (I/O) pins disposed on a load board electrically coupled to a plurality of traces on a first end of a flexible printed circuit board, wherein the plurality of traces are configured to allow traversal of an electrical signal from the plurality of socket ports to a waveguide. Further, the plurality of traces terminate on a second end of the flexible printed circuit board into a plurality of patch antennas, wherein the plurality of patch antennas is adapted to radiate the electrical signal into a cavity of a waveguide adapter, wherein the waveguide comprises the waveguide adapter and a differential backshort microstrip transition block. Further, the structure comprises a power sensor electrically coupled to the waveguide, wherein the waveguide is configured to communicate the electrical signal from the patch antennas to the power sensor.

In one embodiment, a method of performing socket power calibration is disclosed. The method comprises transmitting an electrical signal from a calibrated power source to a first end of a waveguide. The method also comprises receiving the electrical signal using patch antennas at a second end of the waveguide, wherein the patch antennas are coupled to a first end of a flexible printed circuit board. Further, the method comprises communicating the electrical signal to a plurality of socket ports on a load board connected to a second end of the flexible printed circuit board, wherein a plurality of traces are configured to allow traversal of an electrical signal from the first end to the second end of the flexible printed circuit board and measuring a power of the electrical signal at the plurality of socket ports using ATE equipment.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTION

Figure 1:
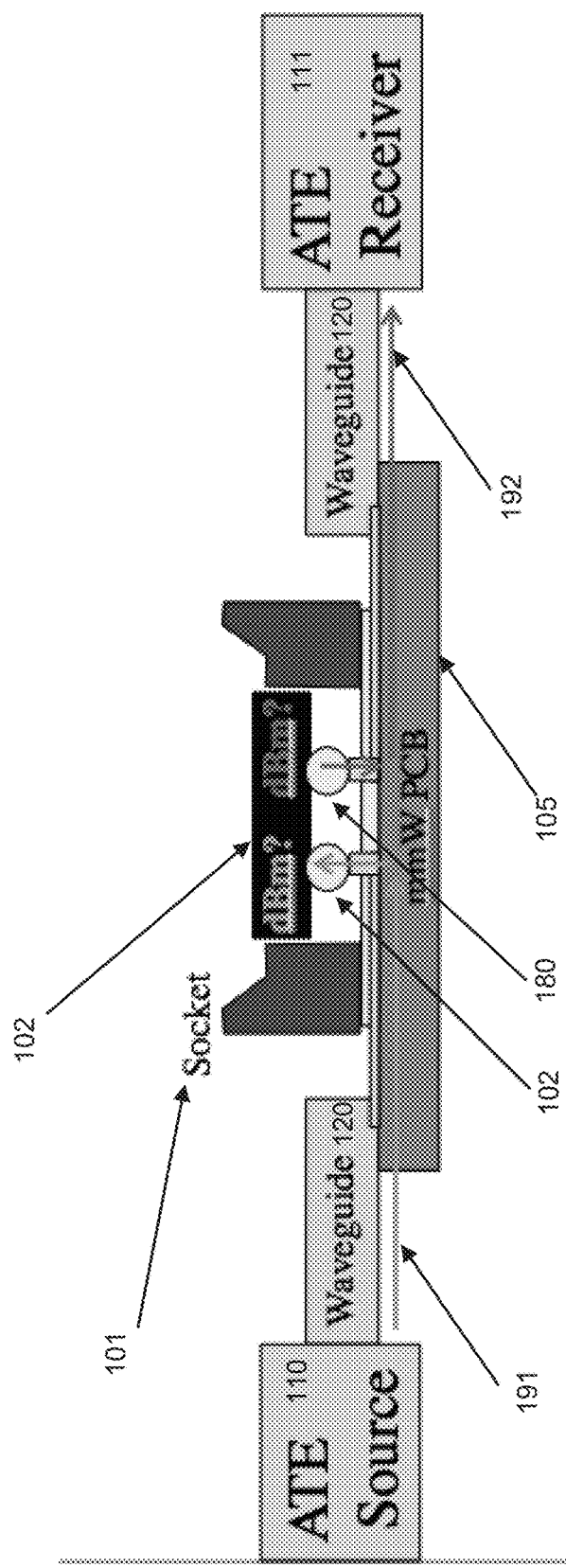
FIG. 1 illustrates an exemplary interface assembly for testing DUTs.
Figure 2:
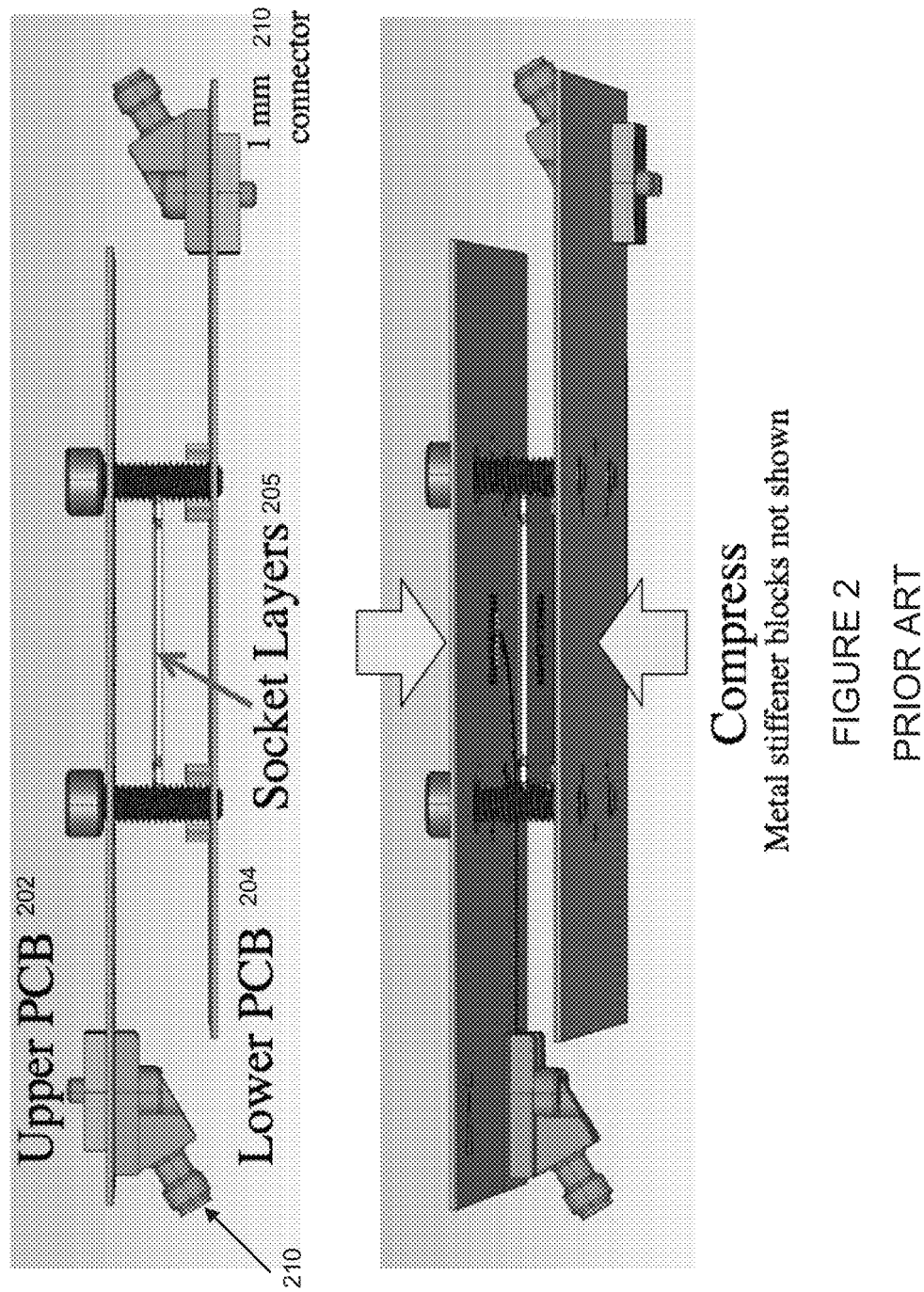
FIG. 2 illustrates a sandwich style socket calibration device, wherein an elastomer layer is sandwiched between two PCB boards.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Embodiments of the present invention provide a method of performing power calibration on a socket without the use of expensive and complex bench equipment like network analyzers. In one embodiment, the present invention is a socket calibration device that interfaces with the socket ports (or DUT IO pins) on one end and also interfaces with a waveguide and power sensor at the other end. The power sensor is typically much easier to use and reasonably priced as compared to a network analyzer. Further, test floor technicians can easily set up and deploy the power sensor for socket calibration as compared to a network analyzer. Therefore, embodiments of the present invention can be deployed on a high volume manufacturing test floor.

In one embodiment, the socket calibration device of the present invention is composed of a flexible printed circuit board (PCB) of a liquid crystal polymer material that contains traces. At one end of the flexible PCB, the traces on the PCB connect to socket ports or DUT I/O pins. PCB ports on the flexible PCB can be used to connect to the socket ports for calibration. On the other end of the flexible PCB, the traces of the PCB end at patch antenna ports which couple with a waveguide. The waveguide then connects with a power sensor that is used for calibration of the socket ports. The flexible PCB can allow the power sensor to advantageously mount from the side so that the orientation of the load board or DUT is not limited.

Embodiments of the present invention have significant advantages over prior techniques. The socket calibration device including the flexible PCB and the power sensor of the present invention is significantly more affordable than expensive and complex bench equipment such as network analyzers. Further, the socket calibration device of the present invention provides differential signaling, which provides more versatility to test engineers in comparison to the single ended signaling of prior techniques. Additionally, the flexible PCB allows the socket calibration device to offer more orientations for mounting with the power sensor, e.g., the flexibility of the PCB allows the power sensor to be advantageously mounted from the side. And, finally, use of the power sensor provides much easier measurement techniques as compared to a network analyzer.

Figure 3:
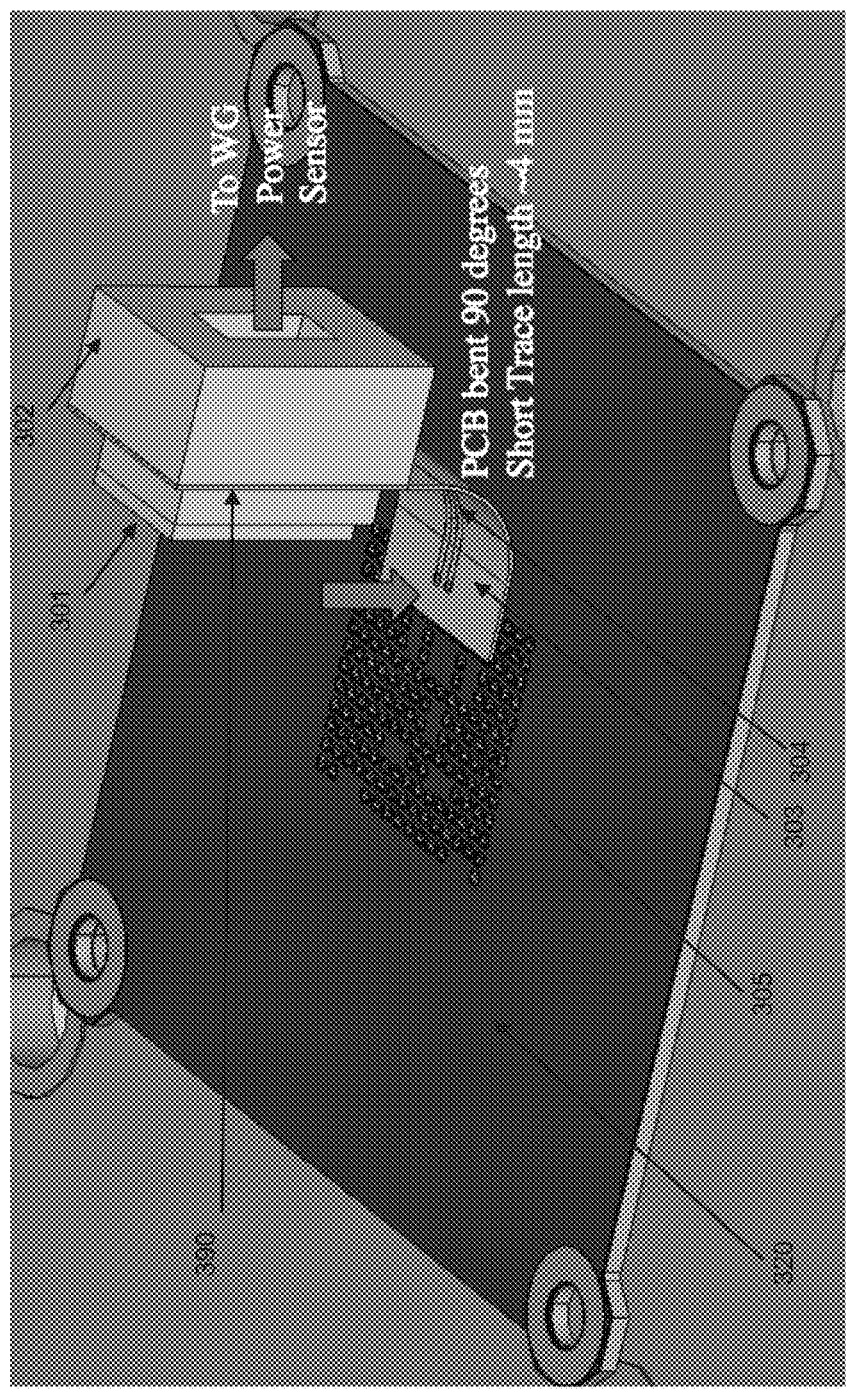
FIG. 3 is a perspective view of an exemplary socket calibration assembly in accordance with embodiments of the present invention.

FIG. 3 is a perspective view of an exemplary socket calibration assembly in accordance with embodiments of the present invention. It should be noted that certain mechanical parts such as the actual socket and DUT are rendered invisible in FIG. 3 in order to illustrate the basic operation of the socket calibration device.

The socket calibration device comprises a flexible PCB 303 that, in one embodiment, can be between 50 and 100 microns thick. In one embodiment, the flexible PCB can be composed of a liquid crystal polymer material. In one embodiment, the flexible PCB is fabricated from a flexible commercially available PCB substrate, e.g., Rogers Ultra-Lam, so that it can be carefully bent to allow greater fixture design freedom. Compared to prior solutions, this approach eliminates the need for expensive mechanical equipment and fixtures.

The flexible PCB contains traces 304 that communicate electrical signals from the socket ports or DUT I/O pins 305 to the power sensor (not shown) connected to waveguide 302. In one embodiment, flexible PCB supports differential signaling.

In one embodiment, the traces on the flexible PCB end at patch antenna ports 390 (disposed on the flexible PCB and sandwiched between a waveguide adapter 302 and a backshort element 301) which couple with a waveguide adapter 302. A differential "backshort" waveguide microstrip transition block 307 is positioned on the other side of the flexible PCB 303. The end of the flexible PCB corresponding to the patch antenna ports is, therefore, sandwiched between the waveguide adapter 302 and the backshort element 301. The waveguide adapter 302 can then be connected to a power sensor for calibration of the socket ports. The flexibility of PCB 303 allows the power sensor to advantageously be mounted from the side so that the load board 320 and the corresponding DUT can be rotated without being constricted to any particular orientation. This approach is also simple and rugged enough to be directly utilized in a high volume manufacturing environment.

In one embodiment, the differential backshort waveguide to microstrip transition allows near 30 GHz or more bandwidth and offers differential signaling. Differential signaling allows more flexibility to test engineers and is more versatile than the single ended signaling offered by prior techniques.

The end of the flexible PCB 303 opposite to the end connected to the waveguide comprises ports that connect to traces 304 and allow the flexible PCB to couple with DUT I/O pins or socket ports. The socket will typically clamp onto the flexible PCB 303 and allow the traces on the PCB to couple with the socket ports.

Figure 4A:
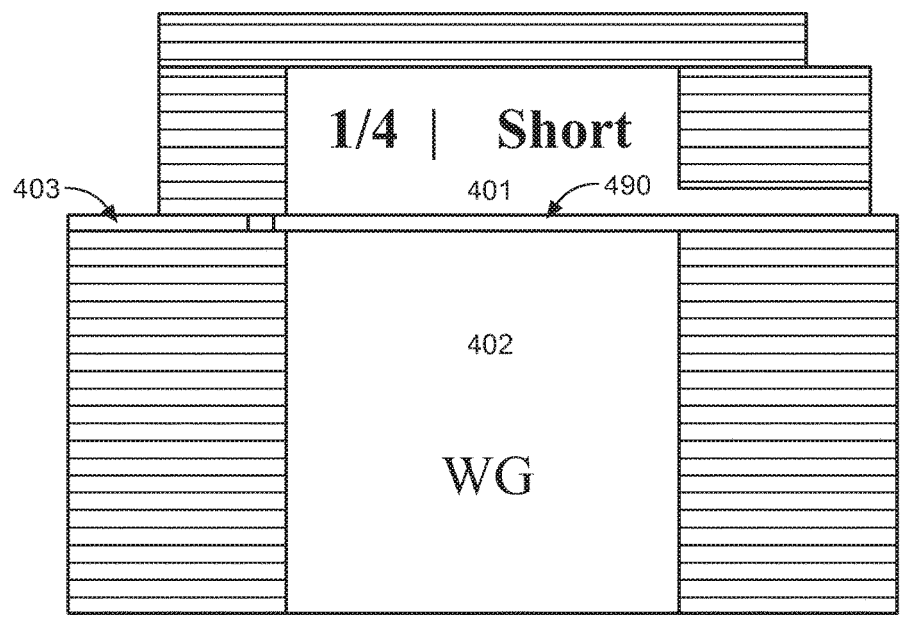
FIG. 4A illustrates the flexible PCB connecting with the waveguide elements in accordance with an embodiment of the present invention.
Figure 4B:
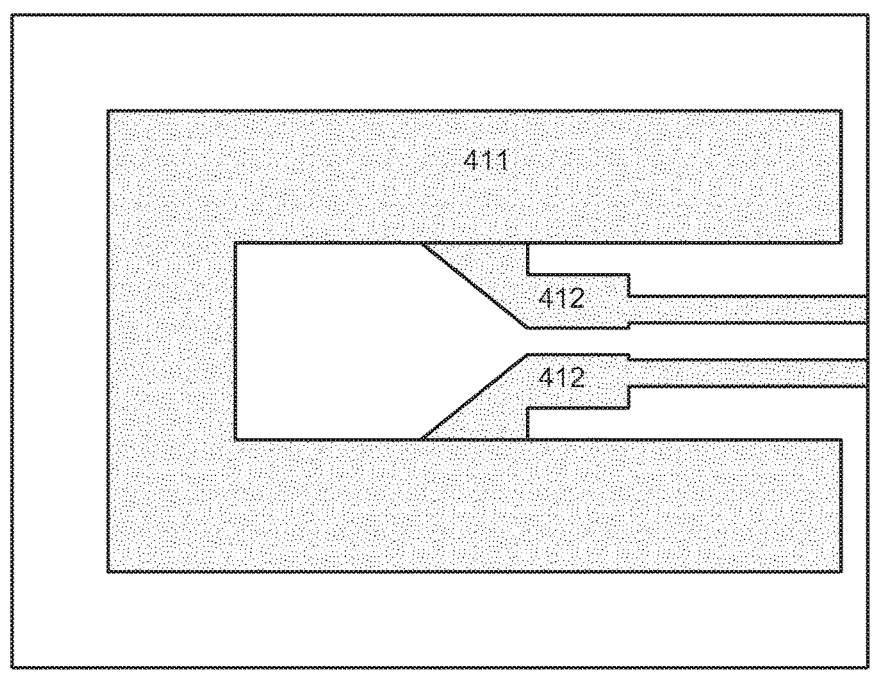
FIG. 4B is a cross-sectional view of the flexible PCB connection with the waveguide adapter in accordance with an embodiment of the present invention.

FIG. 4A is a perspective view of the flexible PCB connecting with the waveguide elements in accordance with an embodiment of the present invention. In one embodiment, the end of the flexible PCB 403 corresponding to the patch antenna ports is sandwiched between a differential backshort waveguide microstrip transition block 401 and a waveguide adapter 402. The patch antennas 490 are disposed on the flexible PCB 403 and are, accordingly, sandwiched between the differential backshort block 401 and the waveguide adapter 402—the patch antenna ports 412 (as shown in FIG. 4B) radiate the differential signal from the DUT to the waveguide. The differential backshort block 401, in one embodiment, can be approximately 1mm in vertical length, which corresponds to a ¼ wavelength at the 76-81 GHz operating frequency range. Differential backshort block 401 is similar in operation to a quarter-wave impedance transformer, which is a component used in electrical engineering consisting of a length of transmission line or waveguide exactly one-quarter of a wavelength ($\lambda$) long and terminated in some known impedance. Capping the waveguide with block 401 is equivalent to placing a short circuit at the top, on the opposite end of waveguide adapter 402. Waveguide block 402 is connected to external circuitry, e.g., the power sensor, as discussed above. Using a waveguide to communicate the signal from the flexible PCB to the power sensor is advantageous because waveguides are the least lossy mediums at high frequencies, and typically much less lossy than PCB traces.

FIG. 4B is a cross-sectional view of the flexible PCB connection with the waveguide adapter in accordance with an embodiment of the present invention. As mentioned above, in one embodiment, the flexible PCB traces 304 end at patch antenna ports 412 which couple with a waveguide adapter 411. The patch antenna ports 412 radiate the differential signal (using two ports as shown in FIG. 4B) from the DUT to the waveguide adapter 411 from where the signals are communicated to the power sensor connected to the other end of the waveguide.

Figure 5A:
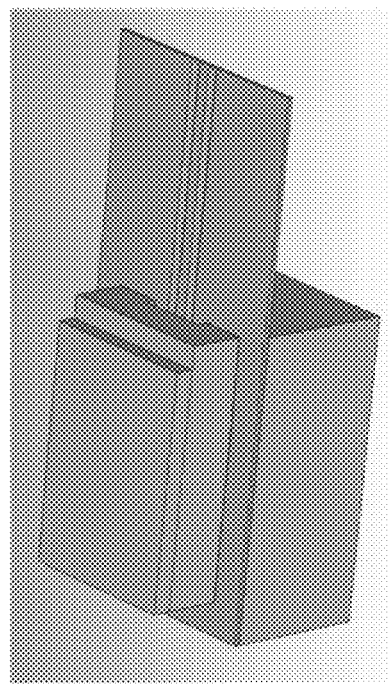
FIGS. 5A and 5B illustrate various orientations for mounting the socket calibration device in accordance with embodiments of the present invention.
Figure 5B:
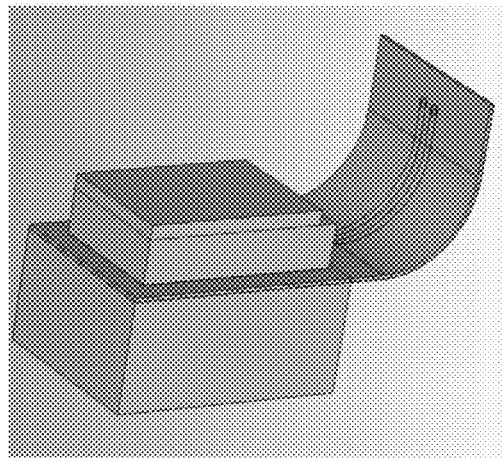

FIGS. 5A and 5B illustrate various orientations for mounting the socket calibration device in accordance with embodiments of the present invention. In one embodiment, as shown in FIG. 5A, the waveguide adapter can be affixed in a horizontal orientation so that the flexible PCB can connect to the socket ports without bending. In a different embodiment, as shown in FIG. 5B, the waveguide adapter is vertical, which requires the flexible PCB to be bent in order to connect with the DUT I/O pins as shown in FIG. 3.

Figure 6A:
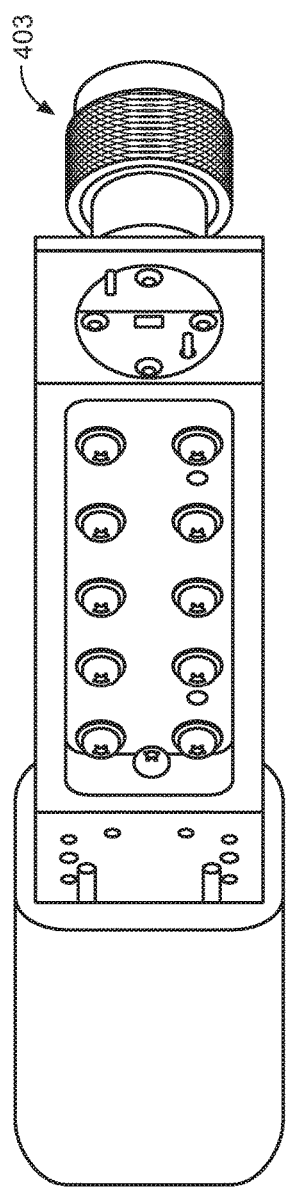
FIGS. 6A and 6B illustrate the power sensor that connects with the waveguide and measures the power of the signal communicated from the socket ports in accordance with embodiments of the present invention.
Figure 6B:
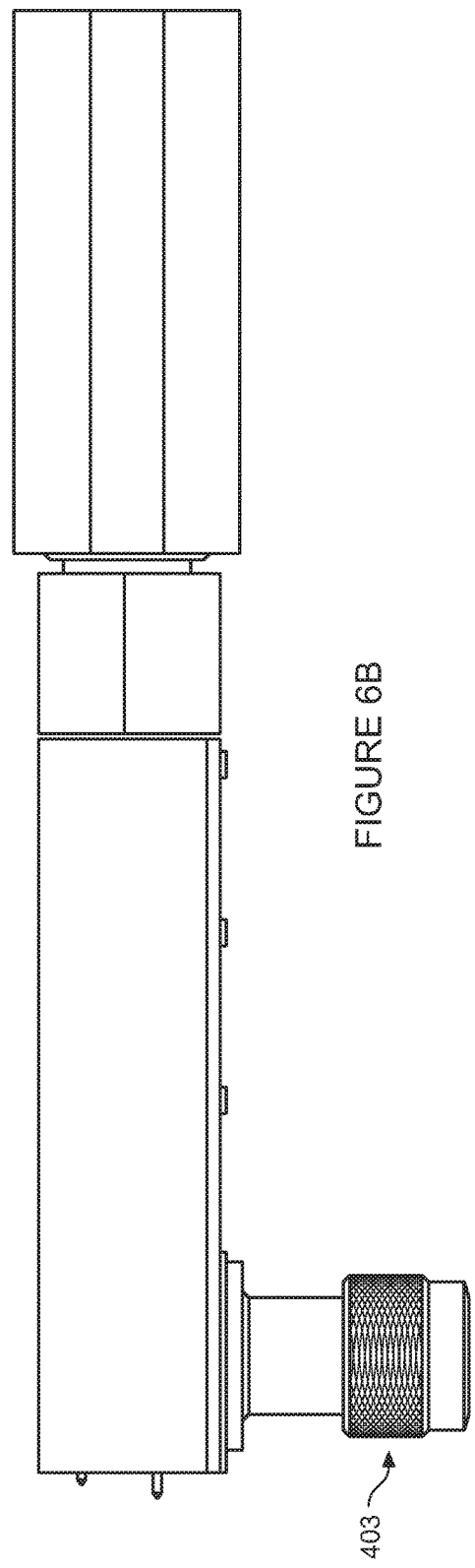

FIGS. 6A and 6B illustrate the power sensor that connects with the waveguide and measures the power of the signal communicated from the socket ports in accordance with embodiments of the present invention. The power sensor matches the operational mode of the DUT and provides enhanced noise and isolation rejection. In one embodiment, the power sensor used can be a waveguide power sensor operable in the 50 to 110 GHz frequency range. The power sensor can also comprise a 50 MHz calibration port to reduce measurement uncertainties.

As shown in FIGS. 6A and 6B the power sensor, in one embodiment, can comprise a circular flange interface 403. The circular flange interface 403 can, in one embodiment, comprise a rectangular waveguide port that allows the power sensor to mate with the waveguide. If the DUT within the socket is generating power, the power sensor mated with the waveguide at the end can be used to determine the power right at the DUT I/O pin or socket port. The power reading right at the DUT I/O pin can then be compared with the power reading at the ATE receiver (e.g. a receiver 111 as shown in FIG. 1) to determine the loss occurring between the socket port and the ATE receiver. The difference can then be used to calibrate the socket.

In one embodiment, instead of mating the waveguide connected with the flexible PCB to a power sensor, a test engineer could deliver power to the DUT I/O pin using a waveguide signal source that generates millimeter wave signals, for example. Using a calibrated power source allows the test engineer to know the amount of power delivered to the DUT I/O pin. This power value can then be compared to the power measured at an ATE source (e.g., source 110 in FIG. 1). The difference between the two readings again can allow a test engineer to calibrate the socket.

In one embodiment, the socket is calibrated by using both the power sensor and the signal source. For example, the socket can be calibrated first by using a power sensor to measure the power at the socket ports. Subsequently, a calibrated power source can be used to deliver power to the socket ports using the calibration fixture of the present invention. The value of the power delivered to the socket ports can be compared with the power measured at the ATE source to determine the difference. This difference can then be used to calibrate the socket.

Figure 7:
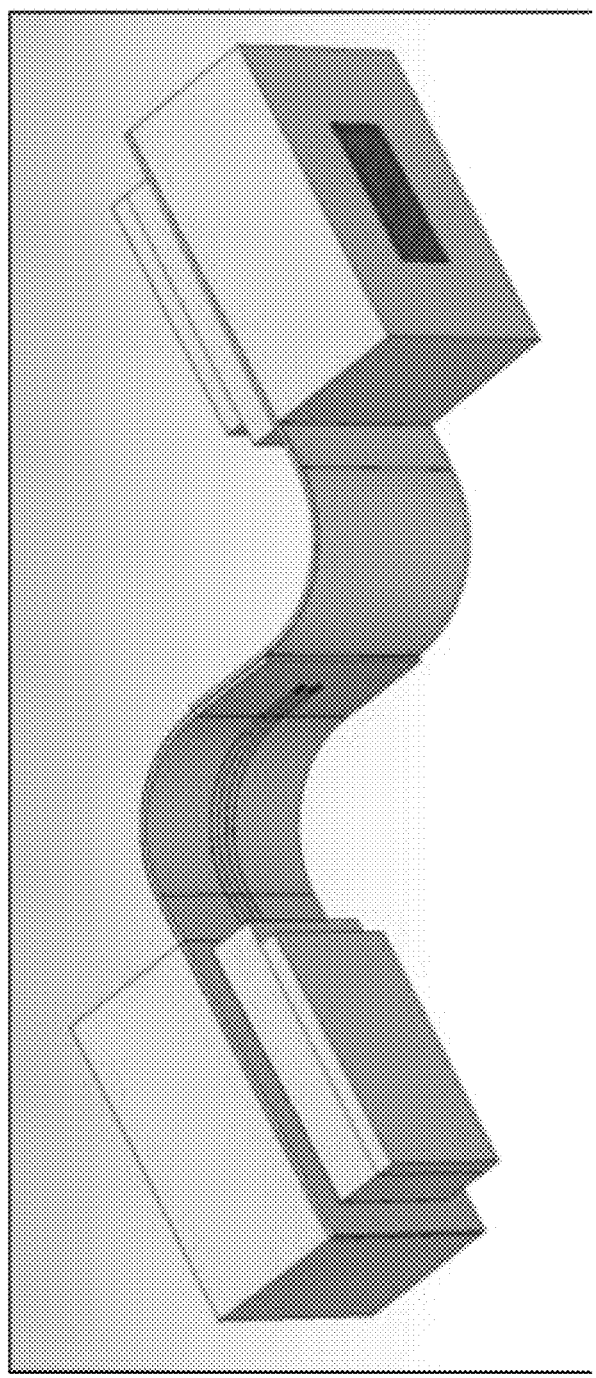
FIG. 7 illustrates a configuration for performing back to back loss measurement in accordance with an embodiment of the present invention.

FIG. 7 illustrates a configuration for performing back-to-back loss measurement in accordance with an embodiment of the present invention. In one embodiment, two flexible PCB cables can be clamped together to provide two discrete back-to-back loss measurements as shown in FIG. 7. One end may be connected to a waveguide signal source whereas the other end may be connected to a waveguide power sensor.

Figure 8:
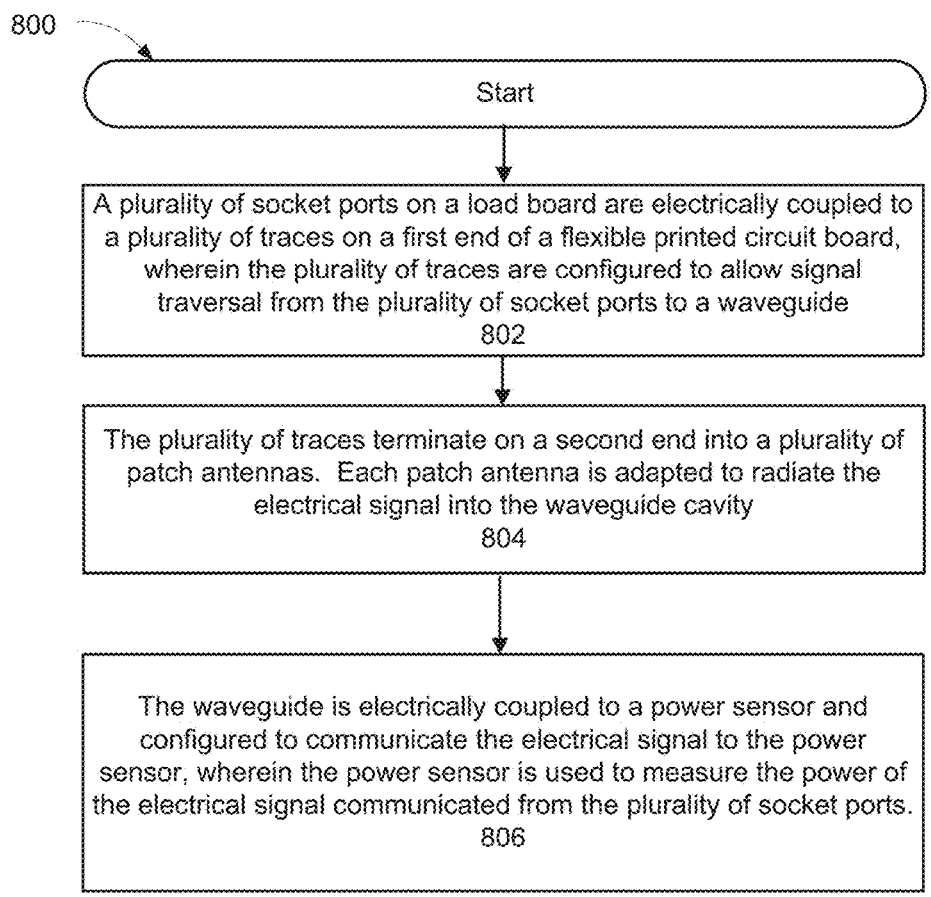
FIG. 8 is a flowchart of an exemplary method of performing socket power calibration using a flexible printed circuit board in accordance with embodiments of the present disclosure.

FIG. 8 is a flowchart of an exemplary method of performing socket power calibration using a flexible printed circuit board in accordance with embodiments of the present disclosure. The disclosure, however, is not limited to the description provided by flowchart 800. Rather, it will be apparent to persons skilled in the relevant art(s) from the teachings provided herein that other functional flows are within the scope and spirit of the present disclosure. Flowchart 800 will be described with continued reference to exemplary embodiments described above, though the method is not limited to those embodiments.

At step 802, a plurality of socket ports on a load board are electrically coupled to a plurality of traces on a first end of a printed circuit board, wherein the plurality of traces are configured to allow signal traversal from the plurality of socket ports to a waveguide.

At step 804, the plurality of traces terminates on a second end into a plurality of patch antennas. Each patch antenna is adapted to radiate the electrical signal into a waveguide cavity.

At step 806, the waveguide is electrically coupled to a power sensor and configured to communicate the electrical signal to the power sensor. The power sensor is used to measure the power of the electrical signal and this power measurement can then be used to calibrate the socket as explained above.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

It should also be understood, of course, that the foregoing relates to exemplary embodiments of the invention and that modifications may be made without departing from the spirit and scope of the invention as set forth in the following claims.

The foregoing description, for purpose of explanation, has been described with reference to specific embodiments.

However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. An apparatus for performing socket power calibration, said apparatus comprising:
   a plurality of socket ports on a load board electrically coupled to a plurality of traces on a first end of a flexible printed circuit board, wherein the plurality of traces are configured to allow transmission of an electrical signal from the plurality of socket ports to a waveguide;
   the plurality of traces terminating on a second end of the flexible printed circuit board into a plurality of corresponding patch antennas, wherein the plurality of corresponding patch antennas is adapted to radiate the electrical signal into the waveguide; and
   a power sensor electrically coupled to the waveguide, wherein the waveguide is configured to communicate the electrical signal from the patch antennas to the power sensor, and wherein the power sensor is configured to measure a power of the electrical signal to obtain a measured power, wherein the measured power is used to perform the socket power calibration.

2. The apparatus of claim 1, wherein the flexible printed circuit board is composed of liquid crystal polymer material.

3. The apparatus of claim 1, wherein the flexible printed circuit board is operable to communicate differential signals.

4. The apparatus of claim 1, wherein the flexible printed circuit board is coupled with the waveguide using a waveguide adapter and a differential backshort microstrip transition block.

5. The apparatus of claim 4, wherein the waveguide adapter is oriented perpendicular to the load board and the flexible printed circuit board is bent at the first end so the plurality of traces make contact with the plurality of socket ports.

6. The apparatus of claim 4, wherein the power sensor is a waveguide power sensor operable in the 50 to 110 GHz frequency range.

7. A method of performing socket power calibration, said method comprising:
   transmitting an electrical signal from a plurality of socket ports on a load board to a plurality of traces on a first end of a flexible printed circuit board, wherein the plurality of traces are configured to allow transmission of an electrical signal from the first end to a second end of the flexible printed circuit board;
   radiating the electrical signal from a plurality of patch antennas on the second end of the flexible printed circuit board into a waveguide; and
   measuring a power of the electrical signal using a power sensor to obtain a measured power, wherein the power sensor is electrically coupled to the waveguide, and wherein the waveguide is configured to communicate the electrical signal from the patch antennas to the power sensor, and wherein the measured power is used to perform the socket power calibration.

8. The method of claim 7, further comprising:
   calibrating an electrical socket connected to the plurality of socket ports using a measurement of the power.

9. The method of claim 7, wherein the flexible printed circuit board is composed of liquid crystal polymer material.

10. The method of claim 7, wherein the flexible printed circuit board is operable to communicate differential signals.

11. The method of claim 7, wherein the flexible printed circuit board is coupled with the waveguide using a waveguide adapter and a differential backshort microstrip transition block, wherein the flexible printed circuit board is clamped between the waveguide adapter and the differential backshort microstrip transition block.

12. The method of claim 7, wherein the power sensor is a waveguide power sensor operable in the 50 to 110 GHz frequency range.

13. A structure for performing socket power calibration, said structure comprising:
   a plurality of device under test (DUT) input/output (I/O) pins disposed on a load board electrically coupled to a plurality of traces on a first end of a flexible printed circuit board, wherein the plurality of traces are configured to allow transmission of an electrical signal from the plurality of DUT I/O pins to a waveguide;
   the plurality of traces terminating on a second end of the flexible printed circuit board into a plurality of patch antennas, wherein the plurality of patch antennas is adapted to radiate the electrical signal into a cavity of a waveguide adapter, wherein the waveguide comprises the waveguide adapter and a differential backshort microstrip transition block; and
   a power sensor electrically coupled to the waveguide, wherein the waveguide is configured to communicate the electrical signal from the patch antennas to the power sensor, and wherein the power sensor is configured to measure a power of the electrical signal to obtain a measured power, wherein the measured power is used to perform the socket power calibration.

14. The structure of claim 13, wherein the flexible printed circuited board is connected to the waveguide by clamping the flexible printed circuit board between the waveguide adapter and the differential backshort microstrip transition block.

15. The structure of claim 13, wherein the flexible printed circuit board is composed of liquid crystal polymer material.

16. The structure of claim 13, wherein the flexible printed circuit board is operable to communicate differential signals.

17. The structure of claim 13, wherein the waveguide adapter is oriented perpendicular to the load board and the flexible printed circuit board is bent at the first end in order for the plurality of traces to make contact with the plurality of DUT I/O pins.

18. The structure of claim 13, wherein the power sensor is a waveguide power sensor operable in the 50 to 110 GHz frequency range.

19. A method of performing socket power calibration, said method comprising:
   transmitting an electrical signal from a calibrated power source to a first end of a waveguide;
   receiving the electrical signal using patch antennas at a second end of the waveguide, wherein the patch antennas are coupled to a first end of a flexible printed circuit board;

conveying the electrical signal to a plurality of socket ports on a load board connected to a second end of the flexible printed circuit board, wherein a plurality of traces are configured to allow transmission of an electrical signal from the first end to the second end of the flexible printed circuit board; and measuring a power of the electrical signal at the plurality of socket ports using ATE equipment to obtain a measured power, wherein the measured power is used to perform the socket power calibration.

20. The method of claim 19, further comprising:

calibrating an electrical socket connected to the plurality of socket ports using a difference between a power value transmitted by the calibrated power source and the measured power.

* * * * *